(12) United States Patent
Lian et al.

(10) Patent No.: US 11,842,007 B1
(45) Date of Patent: Dec. 12, 2023

(54) DISPLAY PANEL AND DISPLAY DEVICE

(71) Applicant: TCL CHINA STAR OPTOELECTRONICS TECHNOLOGY CO., LTD., Guangdong (CN)

(72) Inventors: Zhengqin Lian, Guangdong (CN); Ru Ge, Guangdong (CN); Ying Lu, Guangdong (CN); Lixia Li, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/818,921

(22) Filed: Aug. 10, 2022

(30) Foreign Application Priority Data

Jul. 25, 2022 (CN) .......................... 202210877018.4

(51) Int. Cl.
*G06F 3/041* (2006.01)
*H01L 27/144* (2006.01)
*H01Q 7/00* (2006.01)
*G06F 3/042* (2006.01)
*G06F 3/046* (2006.01)

(52) U.S. Cl.
CPC .......... *G06F 3/04166* (2019.05); *G06F 3/042* (2013.01); *G06F 3/046* (2013.01); *H01L 27/1446* (2013.01); *H01Q 7/00* (2013.01)

(58) Field of Classification Search
CPC ...... G06F 3/04166; G06F 3/042; G06F 3/046; H01L 27/1446; H01Q 7/00
See application file for complete search history.

(56) References Cited

U.S. PATENT DOCUMENTS

| | | | | |
|---|---|---|---|---|
| 2003/0156230 A1* | 8/2003 | Boer | ................... | G06F 3/03542 349/42 |
| 2009/0289919 A1* | 11/2009 | Jung | ................... | G09G 3/3648 345/175 |
| 2012/0154326 A1* | 6/2012 | Liu | ........................ | G06F 3/0446 345/174 |
| 2015/0084899 A1* | 3/2015 | Park | ........................ | G06F 3/041 345/173 |
| 2019/0204989 A1* | 7/2019 | Shin | ........................ | G06F 3/0412 |

FOREIGN PATENT DOCUMENTS

JP        2021-117994        *  8/2021

OTHER PUBLICATIONS

Boer et al. (Active Matrix LCD with Integrated Optical Touch Screen, SID 03 Digest, pp. 1494-1497 (Year: 2003).*
Machine translation of Kawai et al. JP2021-117994 (Year: 2021).*

* cited by examiner

*Primary Examiner* — Patrick N Edouard
*Assistant Examiner* — Joseph P Fox
(74) *Attorney, Agent, or Firm* — HAMRE, SCHUMANN, MUELLER & LARSON, P.C.

(57) ABSTRACT

A display panel and a display device are disclosed. The display panel includes a substrate, a display module, a light-sensing module, and a touch control module. The light-sensing module includes light-sensing units disposed between pixel units and in an array and data lines electrically connected to the light-sensing units in a same column or a same row. The touch control module includes first antennas extending along a first direction and second antennas extending along a second direction.

11 Claims, 9 Drawing Sheets

DISPLAY PANEL AND DISPLAY DEVICE

FIELD OF INVENTION

The present disclosure relates to the field of display technologies, and more particularly, to a display panel and a display device.

BACKGROUND OF INVENTION

In recent years, touch control technologies have been widely used in various electronic products in daily work and life. Since users can directly touch touch screens with hands or other objects to input information, the users' dependence on other input devices (such as keyboards, mouses, or remote controller) is reduced or even eliminated, thereby being convenient for the users' operation. However, touch control technologies only solve the scene of short-range interaction, and the applicable scene is single.

SUMMARY OF INVENTION

The embodiments of the present disclosure provide a display panel and a display device, which combine photoelectric sensing control for remote interaction and electromagnetic touch control for short-range interaction, thereby providing more interactive modes in a single display panel.

In a first aspect, an embodiment of the present disclosure provides a display panel, which includes: a substrate;

a display module disposed on the substrate, wherein, the display module includes a plurality of pixel units arranged in an array, and the pixel units are arrayed in rows along a first direction and arrayed in columns along a second direction;

a light-sensing module disposed on the substrate, wherein, the light-sensing module includes:

a plurality of light-sensing units disposed between the pixel units and in an array; and a plurality of data lines electrically connected to the light-sensing units in a same column or a same row; and a touch control module disposed on the substrate, wherein, the touch control module includes:

a plurality of first antennas extending along the first direction, wherein, the plurality of first antennas form a plurality of first antenna loops; and a plurality of second antennas extending along the second direction, wherein, the plurality of second antennas form a plurality of second antenna loops.

In some embodiments, the touch control module further includes a first main antenna electrically connected to the second antennas, and two of the second antennas form one of the second antenna loops with the first main antenna.

In some embodiments, at least one second antenna is between the two of the second antennas.

In some embodiments, at least one of the data lines extends along the first direction, and two of the first antennas are connected to each other to form one of the first antenna loops.

In some embodiments, at least one first antenna is between the two of the first antennas.

In some embodiments, the light-sensing units include photosensitive thin film transistors, the data lines include first power lines and second power lines, the first power lines are electrically connected to a source electrode of the photosensitive thin film transistors, and the second power lines are electrically connected to a gate electrode of the photosensitive thin film transistors.

In some embodiments, the display panel includes a gate metal layer, a gate insulating layer, an active layer, and a source-drain metal layer disposed in a stack, wherein, the first antennas and the gate metal layer are disposed on a same layer, and the second antennas and the source-drain metal layer are disposed on another same layer.

In some embodiments, the data lines extending along the first direction and the gate metal layer are disposed on the same layer, and the data lines extending along the second direction and the source-drain metal layer are disposed on the another same layer.

In some embodiments, one of the first antennas and one of the data lines extending along the first direction are both disposed between two adjacent rows of the pixel units.

In some embodiments, one of the light-sensing units at least corresponds to a preset number of rows of the pixel units, the preset number of rows is a number of species of connecting lines extending along the first direction, and the connecting lines include the first antennas and the data lines.

In some embodiments, the display panel further includes a passivation layer disposed on the source-drain metal layer, a metal reflective layer disposed on the passivation layer, and a pixel electrode layer disposed on the metal reflective layer, wherein, the metal reflective layer is defined with through-holes to expose the active layer.

In a second aspect, the present disclosure provides a display device including the above display panel.

In the display panel and the display device provided by the embodiments of the present disclosure, the light-sensing module is set on the display panel for photoelectric sensing control, and the touch control module is set at a same time for electromagnetic touch control, which combine the photoelectric sensing control for remote interaction and the electromagnetic touch control for short-range interaction, thereby providing more interactive modes, which provides more conveniences and possibilities.

DESCRIPTION OF DRAWINGS

The following detailed description of specific embodiments of the present disclosure will make the technical solutions and other beneficial effects of the present disclosure obvious with reference to the accompanying drawings.

Figure 1:
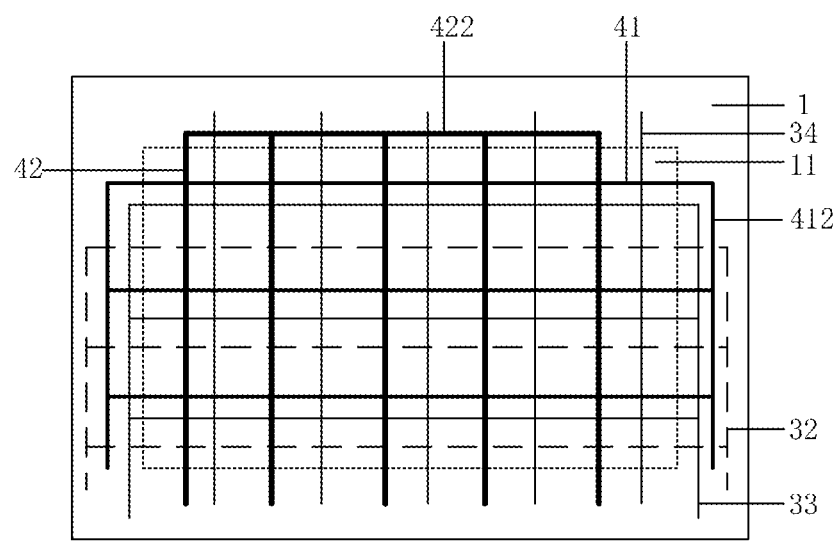
FIG. 1 is a schematic structural diagram of a display panel according to an embodiment of the present disclosure.

Elements in the drawings are designated by reference numerals listed below.

1: substrate; 11: display area; 2: display module; 21: pixel unit; 211: first pixel unit; 212: second pixel unit; 213: third pixel unit; 3: light-sensing module; 31: light-sensing unit; 32: first power line; 33: second power line; 34: read line; 4: touch control module; 41: first antenna; 411: first antenna loop; 412: second main antenna; 42: second antenna; 421: second antenna loop; 422: first main antenna; 51: gate metal layer; 52: gate insulating layer; 53: active layer; 54: source-drain metal layer; 55: passivation layer; 56: pixel electrode layer; 57: metal reflective layer; 61: structural area corresponding to display module; and 62: structural area corresponding to light-sensing module.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one of these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrated connection; it can mean a mechanical connection, an electrical connection, or can communicate with each other; it can mean a direct connection, an indirect connection by an intermediary, or an inner communication or an inter-reaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The following description provides many different embodiments or examples for implementing different structures of the present disclosure. In order to simplify the present disclosure, the components and settings of a specific example are described below. Of course, they are merely examples and are not intended to limit the present disclosure. In addition, the present disclosure may repeat reference numerals and/or reference letters in different examples, which are for the purpose of simplicity and clarity, and do not indicate the relationship between the various embodiments and/or arrangements discussed. In addition, the present disclosure provides examples of various specific processes and materials, but one of ordinary skill in the art will recognize the use of other processes and/or the use of other materials.

Figure 2:
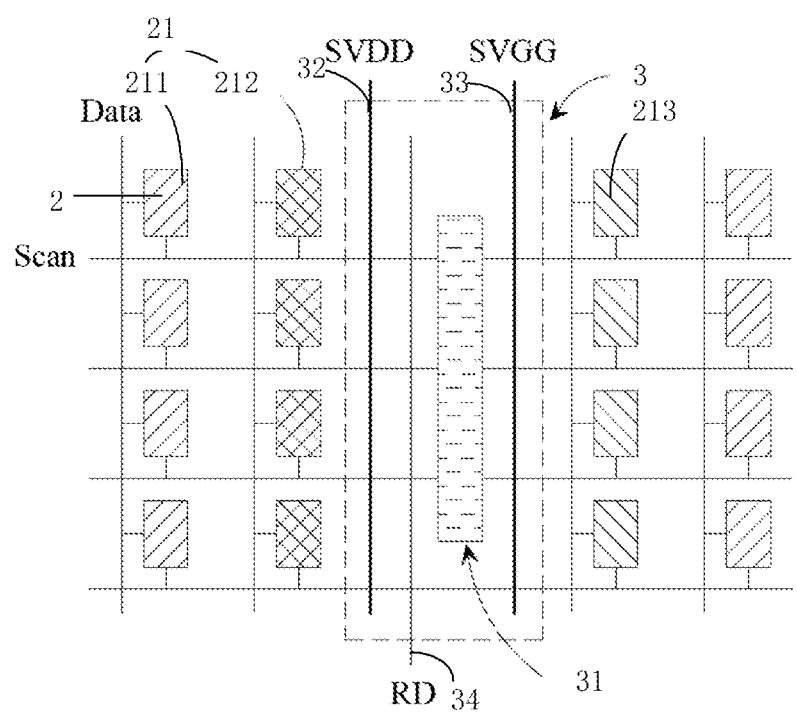
FIG. 2 is a schematic structural diagram of the display panel according to a first embodiment of the present disclosure.

Referring to FIGS. 1 to 12, an embodiment of the present disclosure provides a display panel. The display panel includes a substrate 1, a display module 2, a light-sensing module 3, and a touch control module 4. The display module 2, the light-sensing module 3, and the touch control module 4 are all disposed on the substrate 1. The display module 2 includes a plurality of pixel units 21 arranged in an array, and the pixel units 21 are arrayed in rows along a first direction and arrayed in columns along a second direction. The pixel units 21 may be pixels having different colors arranged in sequence. As shown in FIG. 2, the pixel units 21 include first pixel units 211, second pixel units 212, and third pixel units 213, the first pixel units 211 correspond to red pixels, the second pixel units 212 correspond to green pixels, and the third pixel units 213 correspond to blue pixels. Each column has pixels of a same color, and one of the first pixel units 211, one of the second pixel units 212, and one of the third pixel units 213 that are adjacent to each other are smallest repeating units, and are arranged in rows and extend along the first direction. It should be noted that FIG. 2 is only an example for understanding one arrangement of the display module 2, and should not be construed as being limited thereto.

The light-sensing module 3 includes a plurality of light-sensing units 31 and a plurality of data lines, and the light-sensing units 31 are disposed between the pixel units 21 and in an array. Wherein, the light-sensing units 31 and the pixel units 21 may correspond to each other by one to one, or one light-sensing unit 31 may correspond to multiple rows of pixel units 21. As shown in FIG. 2, one light-sensing unit 31 corresponds to four rows of pixel units 21. In addition, a distribution interval of the light-sensing units 31 may be multiple columns or multiple rows of pixel units 21. As shown in FIG. 2, the pixel units 21 include three colors of red, green, and blue, and the distribution interval of the light-sensing units 31 arranged along the rows is three columns of pixel units 21. The data lines are electrically connected to the light-sensing units 31 in a same column or a same row. The data lines are used to provide constant voltage direct current (DC) signals and transmit sensing signals to the light-sensing units 31.

Figure 3:
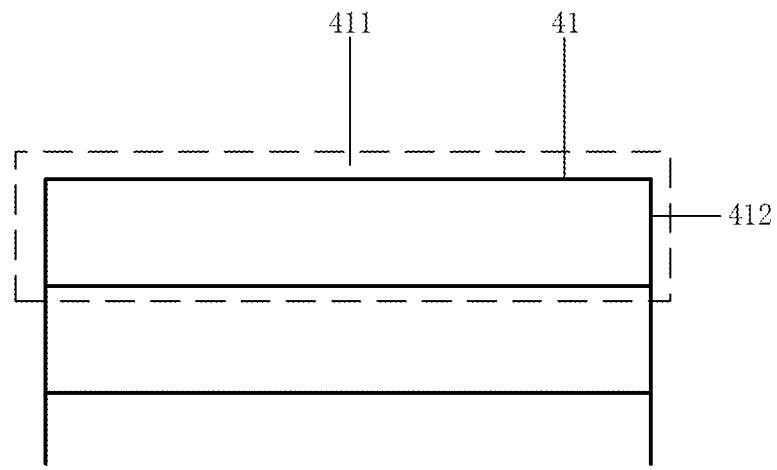
FIG. 3 is a schematic diagram of first antennas according to an embodiment of the present disclosure.
Figure 4:
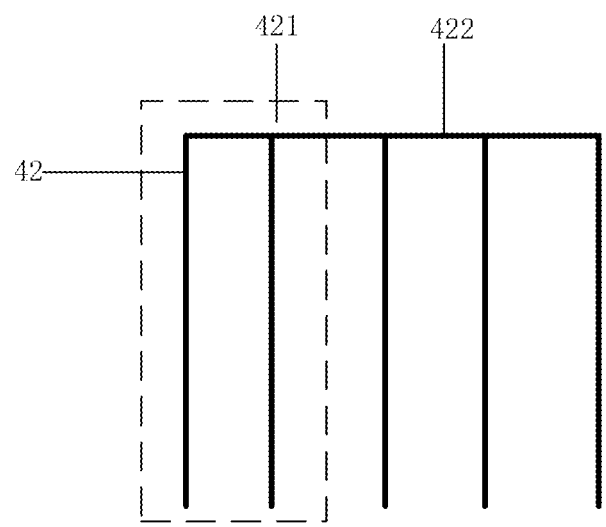
FIG. 4 is a schematic diagram of second antennas according to an embodiment of the present disclosure.

The touch control module 4 includes a plurality of first antennas 41 and a plurality of second antennas 42. The first antennas 41 extend along the first direction, the second antennas 42 extend along the second direction, the plurality of first antennas 41 form a plurality of first antenna loops 411, and the plurality of second antennas 42 form a plurality of second antenna loops 421. FIGS. 3 and 4 only identify one of antenna loops formed by a connection of two adjacent antennas, and in fact, each two adjacent antennas form one loop. It should be noted that the antenna loop formed by connecting the two adjacent antennas shown in FIGS. 3 and 4 is only one example, and two antennas forming one antenna loop may also be separated by a plurality of antennas. In addition, in FIG. 4, a bottom end of the second antennas 42 is connected to a control module (not shown in the figures). When a touch pen clicks on the display panel, the information collected by the first antenna loops 411 is used to determine a position of the click along the first direction, and the information collected by the second antenna loops 421 is used to determine the position of the click along the second direction. The combination of the two can determine the location information of the click.

It should be noted that the substrate 1 is defined with a display area 11 and a non-display area. The display module 2, the light-sensing module 3, and the touch control module 4 are all located in the display area 11. The non-display area is provided with the control module, which is electrically connected to the display module 2, the light-sensing module 3, and the touch control module 4. The light-sensing module 3 and the touch control module 4 transmit collected information to the control module, and the control module analyzes and determines an interactive position. Wherein, the data lines, the first antennas 41, and the second antennas 42 extend from the display area 11 to the non-display area. They may be independently connected to independent control units in the control module, respectively, and may also be partially connected to a same control unit according to needs. It is not specifically limited in the embodiments. The control units may be chip on films (COFs).

The embodiment combines the photoelectric sensing control for remote interaction and the electromagnetic touch control for short-range interaction, thereby providing more interactive modes in a single display panel. Therefore, more conveniences and possibilities can be provided, thereby being suitable for more application scenarios and preventing monotony caused by a single interaction mode.

Figure 5:
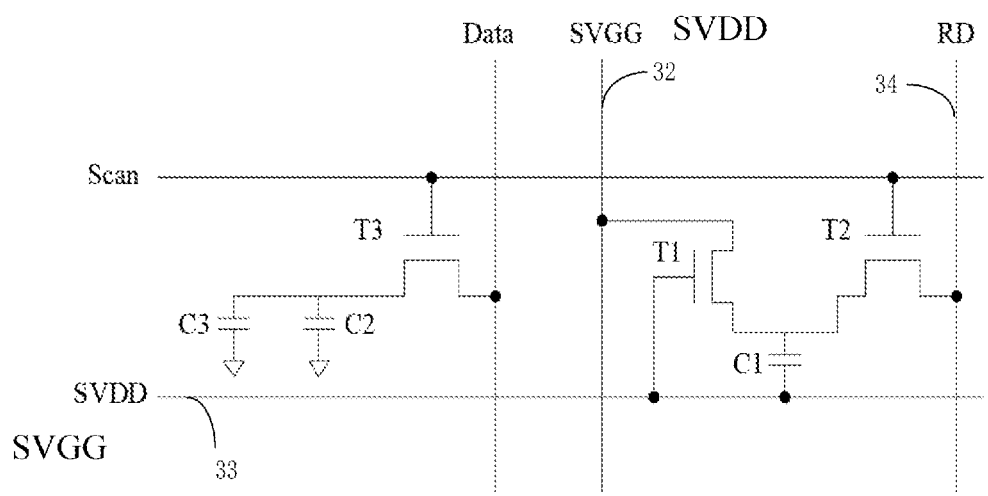
FIG. 5 is a schematic circuit diagram of a light-sensing module according to an embodiment of the present disclosure.

In an embodiment, as shown in FIG. 5, FIG. 5 is a schematic circuit diagram of the light-sensing module 3 according to an embodiment of the present disclosure. Each of the light-sensing units 31 includes a photosensitive thin film transistor T1, a first storage capacitor C1, and a first switching thin film transistor T2. The data lines may include a plurality of first power lines 32SVDD, a plurality of second power lines 33SVGG, and a plurality of read lines 34RD. The first power lines 32SVDD are electrically connected to a source electrode of photosensitive thin film transistors T1. The second power lines 33SVGG are electrically connected to a gate electrode of photosensitive thin film transistors T1 and a first electrode plate of first storage capacitors C1. A drain electrode of the photosensitive thin film transistors T1 is connected to a source electrode of first switching thin film transistors T2 and a second electrode plate of the first storage capacitors C1. A gate electrode of the first switching thin film transistors T2 is connected to scan lines Scan, and a drain electrode of the first switching thin film transistors T2 is connected to the read lines 34RD.

A working principle of the light-sensing module 3 is that the first power lines 32SVDD and the second power lines 33SVGG are constant voltage sources. The photosensitive thin film transistors T1 may keep on a turned-on state and charge the first storage capacitors C1. The first switching thin film transistors T2 are addressing switches, and the scan lines Scan control the first switching thin film transistors T2 to be turned on row by row to detect a capacitance of the first storage capacitors C1.

When light is irradiated on the photosensitive thin film transistors T1, a leakage current of the photosensitive thin film transistors T1 increases, causing the capacitance of the first storage capacitors C1 to change. The first switching thin film transistors T2 detect the change of the first storage capacitors C1. At this time, a sensing signal read by the read lines 34RD from the first switching thin film transistors T2 is a sensing signal generated by the photosensitive thin film transistors T1 due to light irradiation. A photo-sensing position of the display panel can be determined according to the sensing signal read by the read lines 34.

In addition, the display module 2 may include second switching thin film transistors T3, second storage capacitors C2, and third storage capacitors C3. The second storage capacitors C2 and the third storage capacitors C3 are connected in parallel. A gate electrode of the second switching thin film transistors T3 is connected to the scan lines Scan, a source electrode of the second switching thin film transistors T3 is connected to the data lines Data, and a drain electrode of the second switching thin film transistors T3 is connected to one end of the second storage capacitors C2 and the third storage capacitors C3. Another end of the second storage capacitors C2 and the third storage capacitors C3 is grounded. The scan lines Scan control the second switching thin film transistors T3 to be turned on row by row to control a brightness of corresponding pixel units 21.

Figure 6:
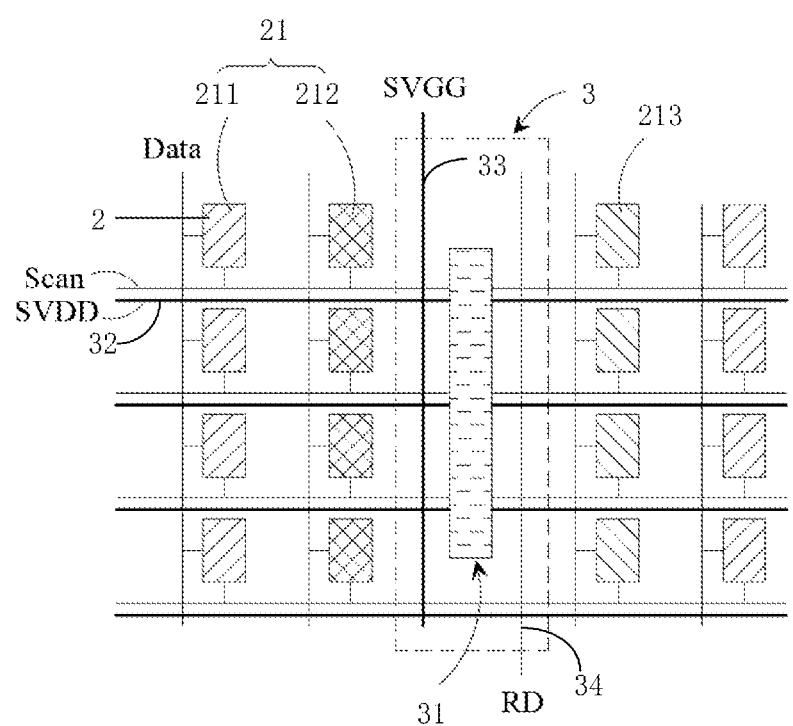
FIG. 6 is a schematic structural diagram of the display panel according to a second embodiment of the present disclosure.
Figure 7:
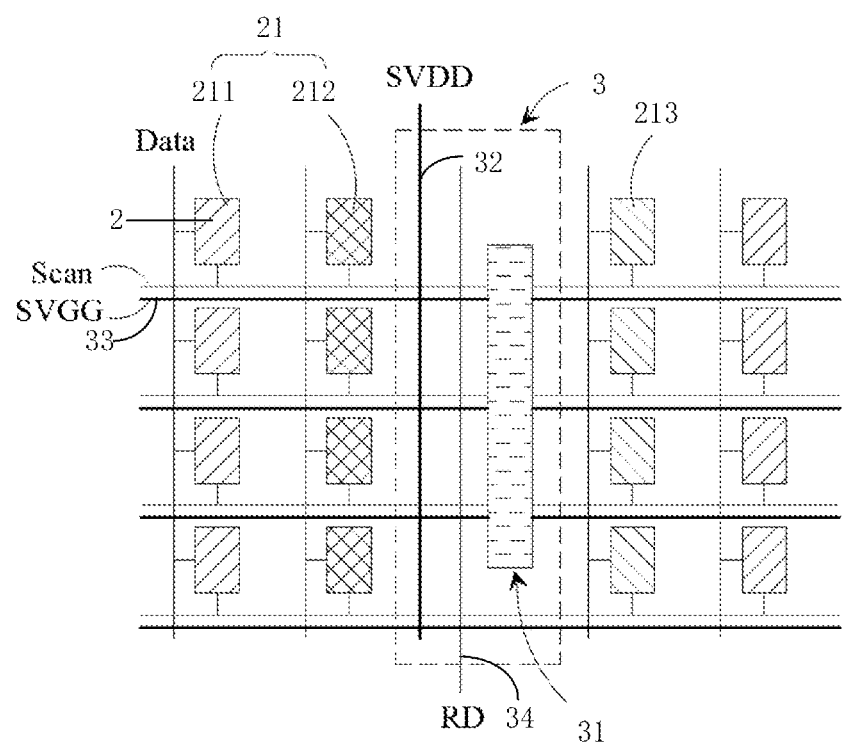
FIG. 7 is a schematic structural diagram of the display panel according to a third embodiment of the present disclosure.
Figure 8:
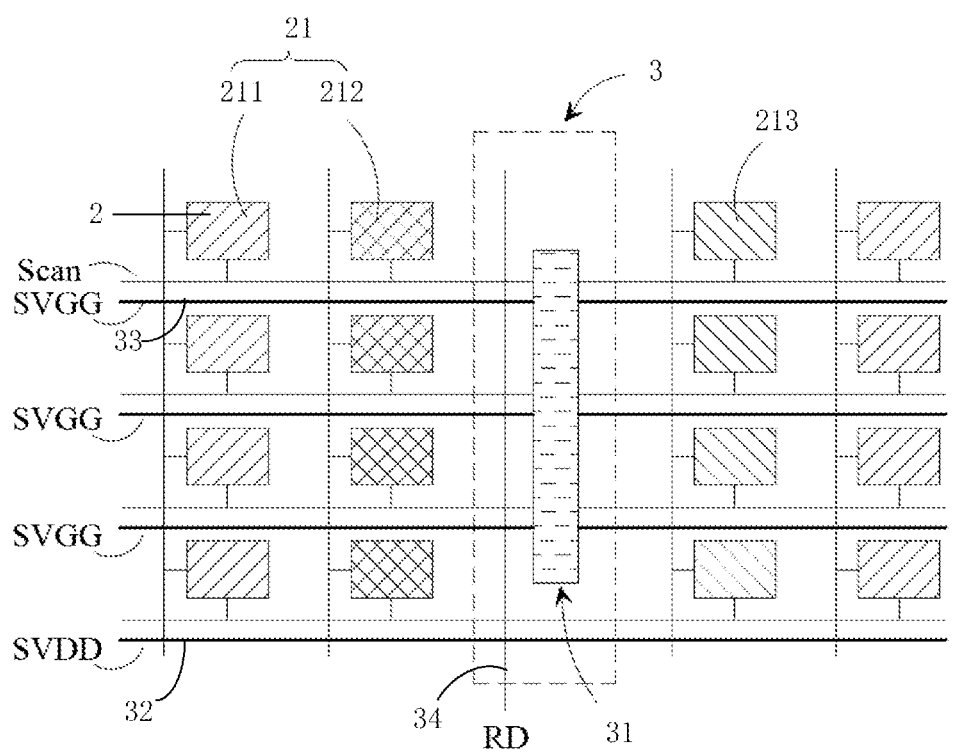
FIG. 8 is a schematic structural diagram of the display panel according to a fourth embodiment of the present disclosure.

In an embodiment, one of the first antennas 41 and one of the data lines extending along the first direction are both disposed between two adjacent rows of pixel units 21. Wherein, extending directions of the first power lines 32SVDD, the second power lines 33SVGG, and the read lines 34RD of the data lines may be freely set according to the layout space of the display panel. As shown in FIG. 2, the first power lines 32SVDD, the second power lines 33SVGG, and the read lines 34RD of the data lines all extend along the second direction, that is, each data line is electrically connected to the light-sensing units 31 in a same column, respectively. As shown in FIG. 6, The first power lines 32SVDD extend along the first direction, and the second power lines 33SVGG and the read lines 34RD extend along the second direction. As shown in FIG. 7, the second power lines 33SVGG extend along the first direction, and the first power lines 32SVDD and the read lines 34RD extend along the second direction. As shown in FIG. 8, the first power lines 32SVDD and the second power lines 33SVGG extend along the first direction, and the read lines 34RD extend along the second direction. In addition, the read lines 34RD may also extend along the first direction.

It should be noted that when there are data lines extending along the first direction and one light-sensing unit 31 corresponds to multiple rows of pixel units 21, the data lines extending along the first direction may be set repeatedly, but in fact, only one of each kind of data lines is needed to be connected to each light-sensing unit 31. As shown in FIG. 8, one light-sensing unit 31 corresponds to four rows of pixel units 21, and both the first power lines 32SVDD and the second power lines 33SVGG extend along the first direction. Correspondingly, there are one first power line 32SVDD and three second power lines 33SVGG disposed between the four rows of pixel units 21 and connected to the light-sensing unit 31. However, in fact, only one second power line 33SVGG needs to be set. Considering that each first antenna 41 is also set between two adjacent rows of pixel units 21, another two second power lines 33SVGG may be replaced by the first antennas 41.

In addition, disposing each data line between any two adjacent rows of pixel units 21 can reduce an area occupied by the light-sensing module 3 in the display area 11, thereby improving an aperture ratio of a display circuit and improving a transmittance of the display panel.

In an embodiment, since each one of the first antennas 41 and each one of the data lines extending along the first direction are both disposed between two adjacent rows of pixel units 21, in order to provide a layout space, one of the light-sensing units 31 at least corresponds to a preset number of rows of pixel units 21. The preset number of rows is a number of species of connecting lines extending along the first direction, and the connecting lines include the first antennas 41 and the data lines. The number of species of connecting lines is a number of the first power lines 32SVDD, the second power lines 33SVGG, and the read lines 34RD extending along the first direction.

When all the connecting lines are disposed along the second direction, then only the first antennas 41 are disposed extending along the first direction, so one light-sensing unit 31 may correspond to one row or multiple rows of pixel units 21. When one of the first power lines 32SVDD, the second power lines 33SVGG, and the read lines 34RD extends along the first direction, then one light-sensing unit 31 at least corresponds to two rows of pixel units 21. When two of the first power lines 32SVDD, the second power lines 33SVGG, and the read lines 34RD extend along the first direction, then one light-sensing unit 31 at least corresponds to three rows of pixel units 21, and so on. When three of the first power lines 32SVDD, the second power lines 33SVGG, and the read lines 34RD all extend along the first direction, then one light-sensing unit 31 at least corresponds to four rows of pixel units 21.

Figure 9:
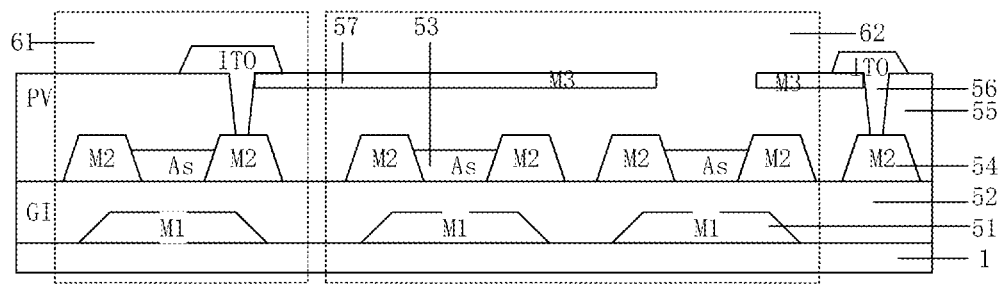
FIG. 9 is a schematic cross-sectional diagram of the display panel according to an embodiment of the present disclosure.
Figure 10:
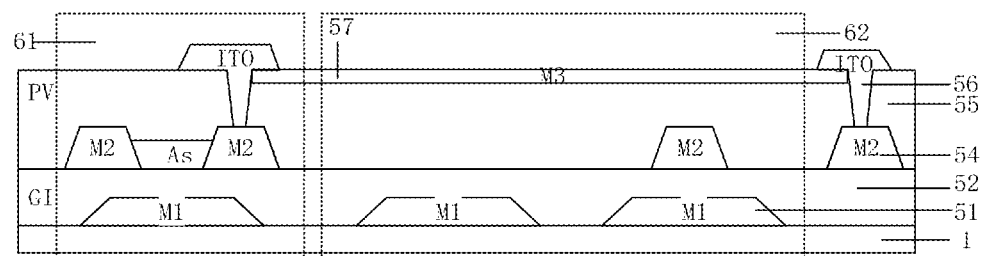
FIG. 10 is a schematic cross-sectional diagram of a dummy region of the display panel according to an embodiment of the present disclosure.

In an embodiment, as shown in FIGS. 9 and 10, the display panel includes a gate metal layer 51, a gate insulating layer 52, an active layer 53, a source-drain metal layer 54, a passivation layer 55, and a pixel electrode layer 56 disposed on the substrate 1 in a stack. Wherein, the element 61 is a structure corresponding to the display module 2, and the element 62 is a structure corresponding to the light-sensing module 3.

The gate metal layer 51 includes a plurality of patterned gate electrodes, such as the gate electrode of the photosensitive thin film transistors T1, the gate electrode of the first switching thin film transistors T2, and the gate electrode of the second switching thin film transistors T3. The gate metal layer 51 also includes a plurality of scan lines Scan extending along the first direction and distributed at intervals in the second direction. The scan lines Scan are connected to the gate electrode of the first switching thin film transistors T2 and the gate electrode of the second switching thin film transistors T3. The scan lines Scan are used to transmit scanning control signals for controlling the first switching thin film transistors T2 and the second switching thin film transistors T3 to be turned on and off.

Wherein, the first antennas 41 extend along the first direction, and the first antennas 41 and the gate metal layer 51 are disposed on the same layer. Similarly, each data line extending along the first direction is also disposed on the same layer as the gate metal layer 51.

The gate metal layer 51 only occupies a partial area of the substrate 1 after patterning, so the gate insulating layer 52 is deposited on the substrate 1 and the gate metal layer 51 to cover the gate metal layer 51 and the substrate 1. A material of the gate insulating layer 52 includes SiNx, SiOx, or a combination thereof.

The active layer 53 is disposed opposite to the gate electrode of each thin film transistor. A material of the photosensitive thin film transistors T1 is amorphous silicon (A-Si). Based on photosensitive properties of amorphous silicon, after the amorphous silicon active layer 53 receives light, photogenerated carriers are generated, so that the current changes, and then the capacitance of the first storage capacitors C1 changes.

The source-drain metal layer 54 includes a plurality of patterned source electrodes and drain electrodes, such as the source electrodes and drain electrodes of the photosensitive thin film transistors T1, the first switching thin film transistors T2, and the second switching thin film transistors T3. The source electrodes and the drain electrodes are disposed at both ends of the active layer 53, and the active layer 53 is exposed in the middle. The source-drain metal layer 54 also includes a plurality of data lines Data extending along the second direction and distributed at intervals in the first direction. The data lines Data are connected to the source electrode of the second switching thin film transistors T3, and the drain electrode of the second switching thin film transistors T3 is electrically connected to corresponding pixel electrodes of the pixel electrode layer 56. When the second switching thin film transistors T3 are turned on, the corresponding pixel electrodes of the pixel electrode layer 56 can be charged through the data lines Data.

Wherein, the second antennas 42 extend along the second direction, and the second antennas 42 and the source-drain metal layer 54 are disposed on a same layer. Similarly, the data lines extending along the second direction and the source-drain metal layer 54 are also disposed on the same layer. It should be noted that as shown in FIG. 10, in the dummy area, metal layer wirings (that is, metal layers M2 in the area 62) are added to form the second antennas 42, which do not occupy the wiring space of the data lines of the light-sensing module 3.

The active layer 53 and the source-drain metal layer 54 only occupy a partial area on the gate insulating layer 52, so the passivation layer 55 is deposited on the active layer 53, the source-drain metal layer 54, and the gate insulating layer 52 to cover the active layer 53, the source-drain metal layer 54, and the gate insulating layer 52. Wherein, the passivation layer 55 is defined with through-holes corresponding to the source-drain metal layer 54 to expose a part of the source-drain metal layer 54, thereby connecting the pixel electrode layer 56 and the source-drain metal layer 54.

In an embodiment, in order to increase reflection and utilization of ambient light, a metal reflective layer 57 is disposed, and energy consumption can also be reduced at a same time. Wherein, a material of the metal reflective layer 57 is silver. In order to prevent the silver layer from oxidizing, the metal reflective layer 57 is disposed between the passivation layer 55 and the pixel electrode layer 56. Wherein, the metal reflective layer 57 occupies a 50% area of a color resist layer. In addition, in order to prevent the metal reflective layer 57 from shielding the light-sensing module 3 to receive optical signals, the metal reflective layer 57 is defined with through-holes to expose the active layer 53 of the photosensitive thin film transistors T1 to receive the optical signals.

Figure 11:
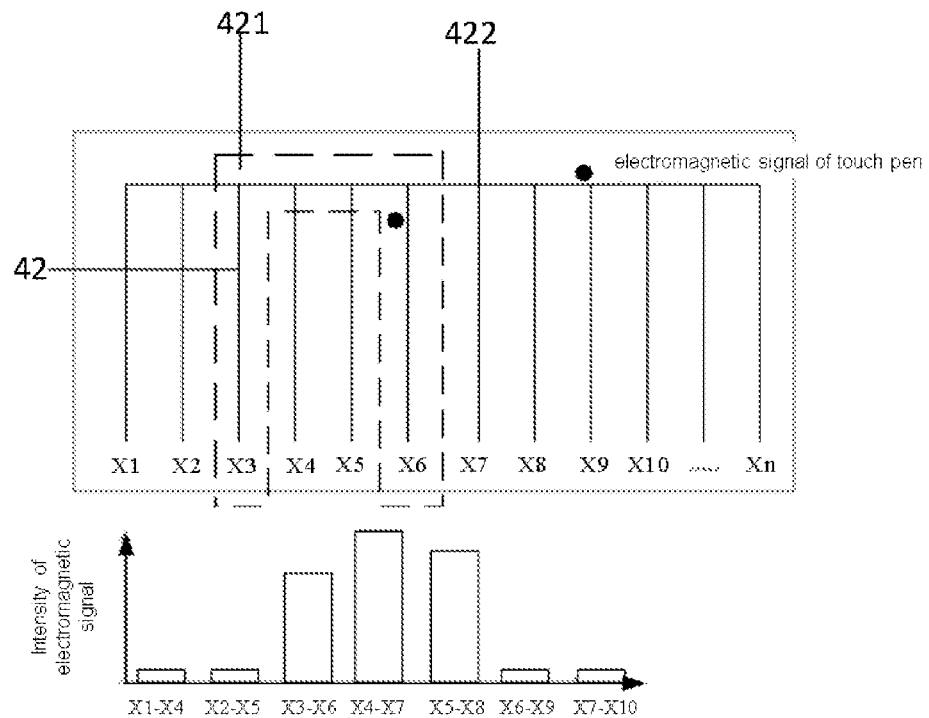
FIG. 11 is a schematic diagram of a working principle of antenna loops according to an embodiment of the present disclosure.

In an embodiment, as shown in FIG. 1, the touch control module 4 further includes a first main antenna 422 electrically connected to all the second antennas 42. That is, one end of all the second antennas 42 is electrically connected to the first main antenna 422, and another end of the second antennas 42 is connected to one end of the control units in the non-display area. Wherein, the second antennas 42 and the first main antenna 422 form a plurality of second antenna loops 421. When a touch pen clicks somewhere, and the clicked place falls within a certain second antenna loop 421, an intensity of electromagnetic signal in a corresponding second antenna loop 421 is different, thereby determining the position of the clicked place of the touch pen in the second direction. As shown in FIG. 11, two second antennas 42 separated by another two second antennas 42 form a second antenna loop 421. The two second antennas 42 of a same second antenna loop 421 are connected to a same control unit in the non-display area. When the clicked place of the touch pen is located between X5 and X6, one second antenna loop 421 including a space between X5 and X6 senses an intensity of electromagnetic signal, and other second antenna loops 421 do not sense the intensity of electromagnetic signal, thereby determining the position of the clicked place of the touch pen being between X5 and X6.

It should be noted that in order to make the sensing positioning more accurate, any two of the second antennas 42 form one of the second antenna loops 421 with the first main antenna 422. The any two of the second antennas 42 may be two adjacent second antennas 42 or two second antennas 42 separated by at least one second antenna 42. As shown in FIG. 11, one of the second antenna loops 421 is formed by the first main antenna 422 and two second antennas 42 that are separated by another two second antennas 42. It should be noted that the second antenna loops 421 formed by every two second antennas 42 that are separated by a preset number of second antennas 42 have a more precise positioning effect.

Similar to the connection method of the second antennas 42, the touch control module 4 also includes a second main antenna 412 that is electrically connected to all the first antennas 41. Any two of the first antennas 41 and the second main antenna 412 form one first antenna loop 411. The any two of the first antennas 41 may be two adjacent first antennas 41 or two first antennas 41 separated by at least one first antenna 41. Similarly, the first antenna loops 411 formed by every two first antennas 41 that are separated by a preset number of first antennas 41 have a more precise positioning effect.

Figure 12:
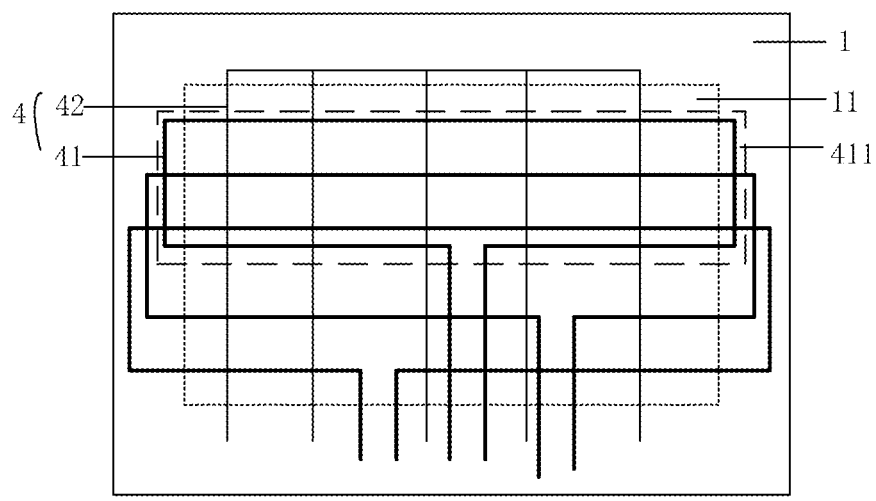
FIG. 12 is another schematic structural diagram of the display panel according to an embodiment of the present disclosure.

In an embodiment, since the first antennas 41 and the data lines extending along the first direction are arranged on the same layer, when there are the data lines extending along the first direction, the data lines extending along the first direction will generate a certain impedance, which will affect the acquisition accuracy of the first antennas 41. Wherein, setting the second main antenna 412 to electrically connect all the first antennas 41 is most affected. Therefore, the first antenna loops 411 are formed by any two first antennas 41 connected independently, and the two first antennas 41 of a same first antenna loop 411 are connected to a same control unit in the non-display area. Further, in order to make the sensing positioning more accurate, one first antenna loop 411 is formed by two first antennas 41 connected independently. The two of the first antennas 41 may be two adjacent first antennas 41 or two first antennas 41 separated by at least one first antenna 41, as shown in FIG. 12. Wherein, the first antenna loops 411 formed by every two first antennas 41 that are separated by the preset number of first antennas 41 have a more precise positioning effect, and the impedance will be lower at a same time.

The embodiment combines the photoelectric sensing control for remote interaction and the electromagnetic touch control for short-range interaction, thereby providing more interactive modes in a single display panel. Therefore, more conveniences and possibilities can be provided, thereby being suitable for more application scenarios and preventing monotony caused by a single interaction mode.

In the above embodiments, the description of each embodiment has its own emphasis. For a part that is not described in detail in an embodiment, refer to the related descriptions of other embodiments.

An embodiment of the present disclosure further provides a display device, which includes the display panel in the above embodiments.

The technical features of the above-described embodiments can be combined arbitrarily. For the sake of brevity, all possible combinations of the technical features in the above-described embodiments are not described. However, as long as there is no contradiction between the combinations of these technical features, all should be regarded as the scope described in the present disclosure.

The display panel and the display device provided by the embodiments of the present disclosure are described in detail above. Specific examples are used herein to explain the principles and implementation of the present disclosure. The descriptions of the above embodiments are only used to help understand the method of the present disclosure and its core ideas; meanwhile, for those skilled in the art, the range of specific implementation and application may be changed according to the ideas of the present disclosure. In summary, the content of the specification should not be construed as causing limitations to the present disclosure.

What is claimed is:

1. A display panel, comprising:
   a substrate;
   a display module disposed on the substrate, wherein the display module comprises a plurality of pixel units arranged in an array, and the pixel units are arrayed in rows along a first direction and arrayed in columns along a second direction;
   a light-sensing module disposed on the substrate, wherein the light-sensing module comprises:
      a plurality of light-sensing units disposed between the pixel units and in an array; and
      a plurality of data lines electrically connected to the light-sensing units in a same column or a same row;
   a touch control module disposed on the substrate, wherein the touch control module comprises:
      a plurality of first antennas extending along the first direction, wherein the plurality of first antennas form a plurality of first antenna loops; and a plurality of second antennas extending along the second direction, wherein the plurality of second antennas form a plurality of second antenna loops;

a gate metal layer, a gate insulating layer, an active layer, and a source-drain metal layer disposed in a stack, wherein the first antennas and the gate metal layer are disposed on a same layer, and the second antennas and the source-drain metal layer are disposed on another same layer; and wherein the data lines extending along the first direction and the gate metal layer are disposed on the same layer, and the data lines extending along the second direction and the source-drain metal layer are disposed on the another same layer.

2. The display panel according to claim 1, wherein the touch control module further comprises a first main antenna electrically connected to the second antennas, and two of the second antennas form one of the second antenna loops with the first main antenna.

3. The display panel according to claim 2, wherein at least one second antenna is between the two of the second antennas.

4. The display panel according to claim 1, wherein at least one of the data lines extends along the first direction, and two of the first antennas are connected to each other to form one of the first antenna loops.

5. The display panel according to claim 4, wherein at least one first antenna is between the two of the first antennas.

6. The display panel according to claim 1, wherein the light-sensing units comprise photosensitive thin film transistors, the data lines comprise first power lines and second power lines, the first power lines are electrically connected to a source electrode of the photosensitive thin film transistors, and the second power lines are electrically connected to a gate electrode of the photosensitive thin film transistors.

7. The display panel according to claim 1, wherein one of the first antennas and one of the data lines extending along the first direction are both disposed between two adjacent rows of the pixel units.

8. The display panel according to claim 7, wherein one of the light-sensing units at least corresponds to a preset number of rows of the pixel units, the preset number of rows is a number of species of connecting lines extending along the first direction, and the connecting lines comprise the first antennas and the data lines.

9. The display panel according to claim 1, wherein one of the first antennas and one of the data lines extending along the first direction are both disposed between two adjacent rows of the pixel units.

10. A display device, comprising the display panel according to claim 1.

11. A display panel, comprising:
a substrate;
a display module disposed on the substrate, wherein the display module comprises a plurality of pixel units arranged in an array, and the pixel units are arrayed in rows along a first direction and arrayed in columns along a second direction;
a light-sensing module disposed on the substrate, wherein the light-sensing module comprises:
a plurality of light-sensing units disposed between the pixel units and in an array; and
a plurality of data lines electrically connected to the light-sensing units in a same column or a same row;
a touch control module disposed on the substrate, wherein the touch control module comprises:
a plurality of first antennas extending along the first direction, wherein the plurality of first antennas form a plurality of first antenna loops; and
a plurality of second antennas extending along the second direction, wherein the plurality of second antennas form a plurality of second antenna loops;
a gate metal layer, a gate insulating layer, an active layer, and a source-drain metal layer disposed in a stack, wherein the first antennas and the gate metal layer are disposed on a same layer, and the second antennas and the source-drain metal layer are disposed on another same layer; and
a passivation layer disposed on the source-drain metal layer, a metal reflective layer disposed on the passivation layer, and a pixel electrode layer disposed on the metal reflective layer, wherein the metal reflective layer is defined with through-holes to expose the active layer.

* * * * *